United States Patent [19]

Nishikawa et al.

[11] Patent Number: 5,159,169
[45] Date of Patent: Oct. 27, 1992

[54] LASER SPUTTERING APPARATUS

[75] Inventors: Yukio Nishikawa, Ikeda; Yoshikazu Yoshida, Izumi; Kunio Tanaka, Toyonaka, all of Japan

[73] Assignee: Matsushita Electric Industrial Co., Ltd., Osaka, Japan

[21] Appl. No.: 627,931

[22] Filed: Dec. 14, 1990

[30] Foreign Application Priority Data

Dec. 14, 1990 [JP] Japan ................................. 1-325060

[51] Int. Cl.⁵ ............................................. B23K 26/00
[52] U.S. Cl. .............................. 219/121.6; 219/121.74; 219/121.75
[58] Field of Search ........... 219/121.6, 121.65, 121.74, 219/121.75, 121.86, 121.73; 204/298.02, 192.1; 422/53.1

[56] References Cited

U.S. PATENT DOCUMENTS

| | | | |
|---|---|---|---|
| 4,758,533 | 7/1988 | Magee et al. | 437/173 |
| 5,017,277 | 5/1991 | Yoshida et al. | 204/298.02 |
| 5,055,653 | 10/1991 | Funami et al. | 29/121.75 |

*Primary Examiner*—C. L. Albritton
*Attorney, Agent, or Firm*—Wenderoth, Lind & Ponack

[57] ABSTRACT

A laser sputtering apparatus comprising: a laser oscillator for emitting a pulsed laser beam; an optical unit for uniforming intensity of the laser beam; a vacuum tank which contains a target; and an optical system for irradiating the laser beam onto the target through the optical unit.

4 Claims, 3 Drawing Sheets

LASER SPUTTERING APPARATUS

BACKGROUND OF THE INVENTION

The present invention relates to a sputtering apparatus for forming a thin film on a thin-film device or the like by using a laser.

An example of a laser sputtering apparatus of this kind was disclosed in the Japanese Journal of Applied Physics in 1988 by Komura et al. and has an arrangement shown in FIG. 1. In this known laser sputtering apparatus, a target 16 and a substrate base 17 are provided in a vacuum tank 15 such that the substrate base 17 confronts the target 16. A substrate 18 is mounted on the substrate base 17. Meanwhile, a laser beam 19 of the second higher harmonic of visible light of a Q-switch YAG laser, which has a wavelength of 532 nm, is converged by an optical system 20 and is irradiated, through a vacuum sealing window 21 secured to the vacuum tank 15, onto the target 16 so as to deposit on the substrate 18, a thin film formed by material of the target 16.

However, in the known laser sputtering apparatus of the above described arrangement, the amount of processing of the target 16 varies with location of the target 16 due to distribution of intensity of the laser beam 19, thereby resulting in nonuniform thickness of the thin film deposited on the substrate 18. In order to make the thickness of the deposited thin film uniform, the substrate 18 may be moved in the vacuum tank 15 as in other sputtering apparatuses. However, in this case, the mechanism becomes quite complicated and it is difficult to cope with the change in thickness of the deposited thin film over time.

Meanwhile, particles forming the thin film deposited on the substrate 18 have different shapes due to a distribution of the intensity of the laser beam 19, thus making the structure of the thin film nonuniform.

SUMMARY OF THE INVENTION

Accordingly, an essential object of the present invention is to provide, with a view to eliminating the disadvantages inherent in the conventional laser sputtering apparatus, a laser sputtering apparatus having a simple construction, which is capable of forming a thin film having uniform thickness and structure.

In order to accomplish this object of the present invention, a laser sputtering apparatus according to the present invention comprises: a laser oscillator for emitting a pulsed laser beam; an optical unit for uniforming intensity of the laser beam; a vacuum tank which contains a target; and an optical system for irradiating the laser beam onto the target through the optical unit. The optical unit is formed by a combination of aspherical lenses or a combination of aspherical mirrors or a tubular scattering optical device.

By the above described arrangement of the laser sputtering apparatus, the central portion of the laser beam, which is most likely to have high intensity, is passed through the aspherical lenses or the aspherical mirrors or the tubular scattering optical device such that distribution of the intensity of the laser beam is made uniform. Therefore, a force for effecting sputtering by irradiating the laser beam onto the target is also made uniform. As a result, processing of the target based on sputtering action of the laser beam is made uniform and thus, the thin film having uniform thickness and structure can be obtained.

BRIEF DESCRIPTION OF THE DRAWINGS

This object and features of the present invention will become apparent from the following description taken in conjunction with the preferred embodiments thereof with reference to the accompanying drawings, in which.

Before the description of the present invention proceeds, it is to be noted that like parts are designated by like reference numerals throughout the several views of the accompanying drawings.

DETAILED DESCRIPTION OF THE DRAWINGS

Figure 1:
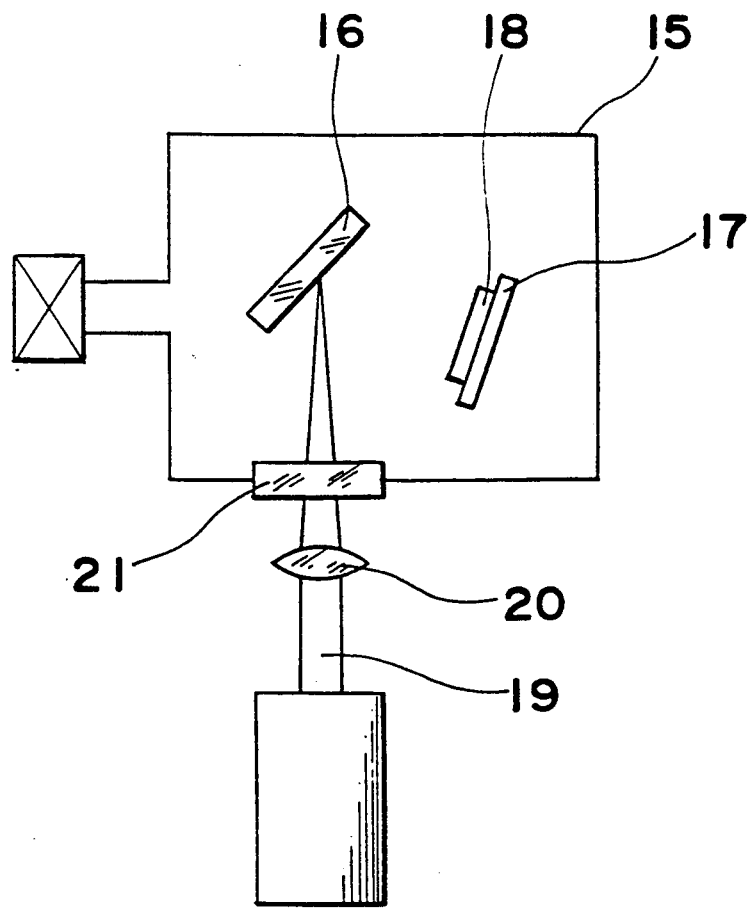
FIG. 1 is a schematic view of a prior art laser sputtering apparatus already referred to)
Figure 2:
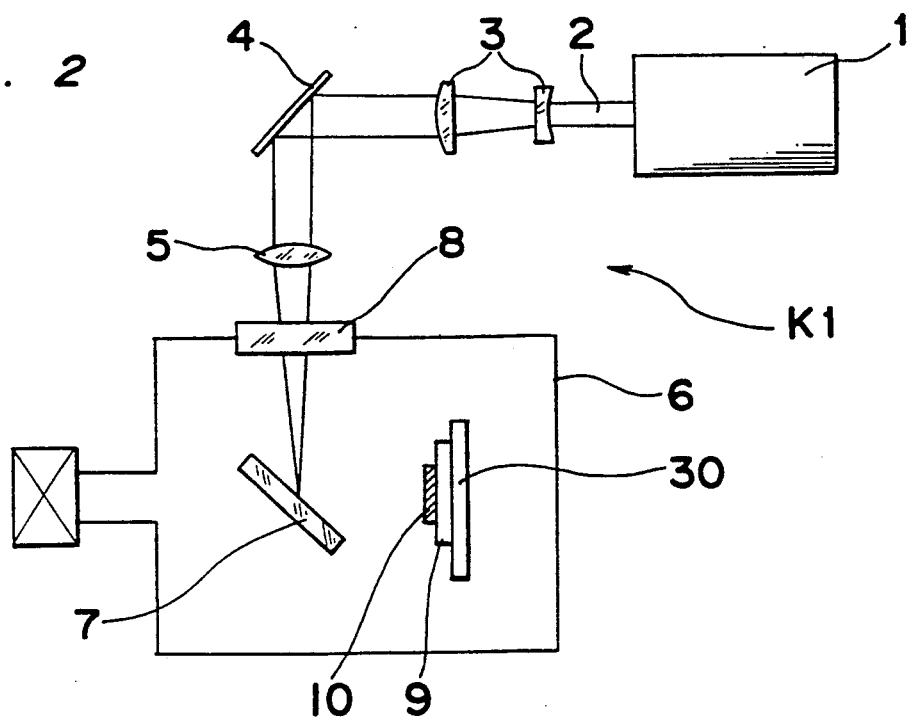
FIG. 2 is a schematic view of a laser sputtering apparatus according to a first embodiment of the present invention.

Referring now to the drawings, there is shown in FIG. 2, a laser sputtering apparatus K1 according to a first embodiment of the present invention. The laser sputtering apparatus K1 includes a laser oscillator 1 for emitting a pulsed laser beam 2, a group of aspherical lenses 3, a reflecting mirror 4, a condenser lens 5, a vacuum tank 6, a target 7, a vacuum sealing window 8 secured to the vacuum tank 6, a substrate base 30, a substrate 9 mounted on the substrate base 30 and a thin film 10 formed on the substrate 9. The target 7 and the substrate base 30 are provided in the vacuum tank 6 so as to confront each other. The pulsed laser beam 2 emitted by the laser oscillator 1 is passed through the aspherical lenses 3 so as to have a uniform distribution of intensity and then, is guided to the condenser lens 5 by the reflecting mirror 4. Subsequently, the pulsed laser beam 2 is converged and irradiated, via the vacuum sealing window 8, onto the target 7 provided in the vacuum tank 6. The target 7 is processed by the converged laser beam 2 so as to be scattered by sputtering action of the laser beam 2 such that the thin film 10 is formed on the substrate 9 by the scattered substance of the target 7.

Figure 3:
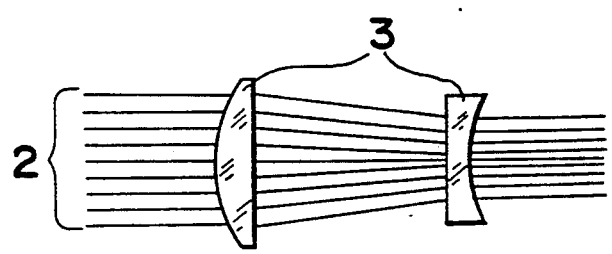
FIG. 3 is a view showing the relationship between aspherical lenses and a distribution of intensity of a laser beam in the laser sputtering apparatus of FIG. 2.

FIG. 3 shows relationship between the aspherical lenses 3 and the distribution of intensity of the laser beam 2 in the laser sputtering apparatus K1. Generally, the distribution of intensity of the laser beam 2 is such that a central portion of the laser beam 2 exhibits the highest intensity as in a Gaussian distribution. When such laser beam 2 is passed through the aspherical lenses 3 having predetermined shapes, the distribution of intensity of the laser beam 2 can be made uniform. As a result, sputtering action of the laser beam 2 on the target 7 is made uniform, so that the thickness and structure of the thin film 10 formed on the substrate 9 can also be made uniform.

Figure 4:
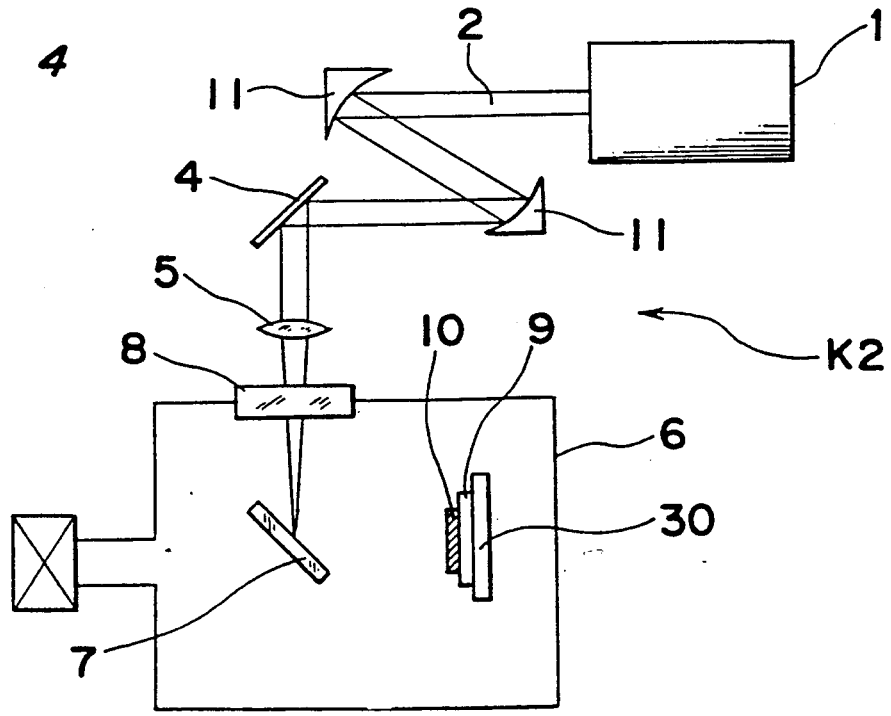
FIG. 4 is a schematic view of a laser sputtering apparatus according to a second embodiment of the present invention.

FIG. 4 shows a laser sputtering apparatus K2 according to a second embodiment of the present invention.

The laser sputtering apparatus K2 is different from the laser sputtering apparatus K1 in that the laser sputtering apparatus K2 employs a pair of aspherical mirrors 11 in place of the aspherical lenses 3 of the laser sputtering apparatus K1. Since the remaining construction of the laser sputtering apparatus K2 is the same as that of the laser sputtering apparatus K1, the description thereof is abbreviated for the sake of brevity. In the laser sputtering apparatus K2, the distribution of intensity of the pulsed laser beam 2 emitted by the laser oscillator 1 is made uniform by the aspherical mirrors 11. Then, in the same manner as in the laser sputtering apparatus K1, the laser beam 2 is irradiated onto the target 7 such that the thin film 10 having uniform thickness and structure is formed on the substrate 9.

Figure 5:
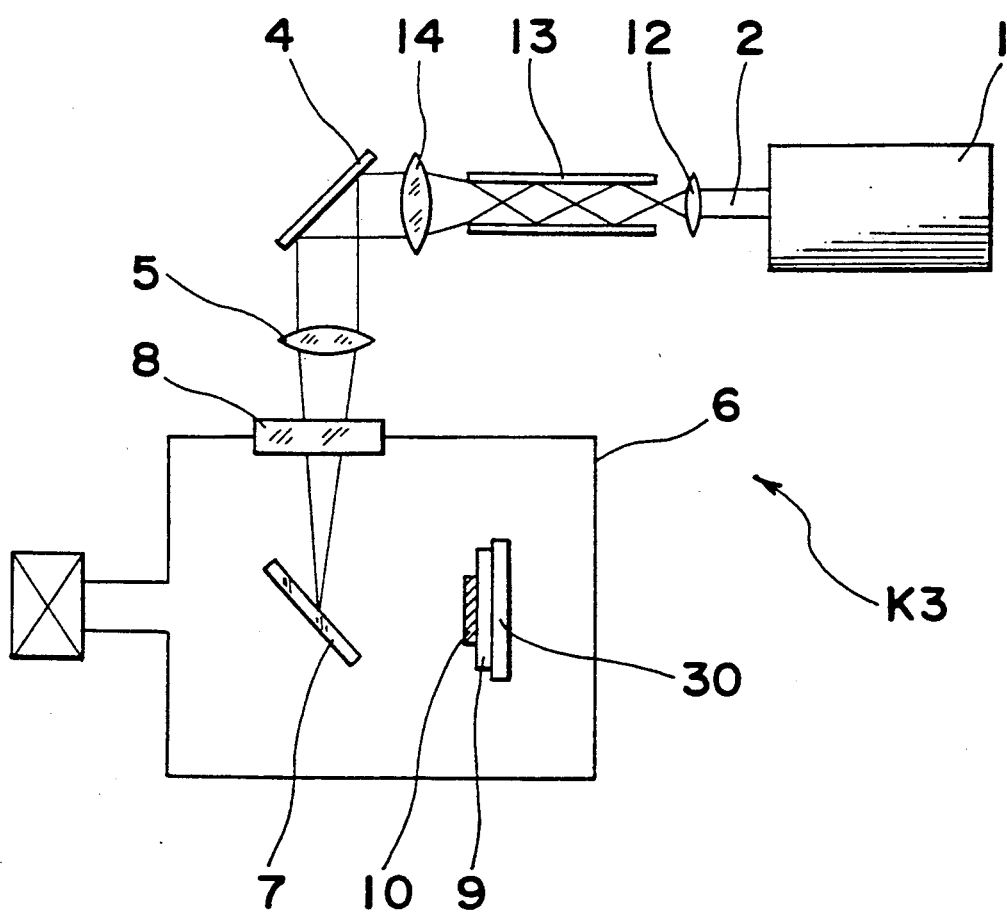
FIG. 5 is a schematic view of a laser sputtering apparatus according to a third embodiment of the present invention.

FIG. 5 shows a laser sputtering apparatus K3 according to a third embodiment of the present invention. The laser sputtering apparatus K3 includes a condenser lens 12, a tubular scattering optical device 13 and a convex lens 14 in place of the aspherical lenses 3 of the laser sputtering apparatus K1. Since remaining construction of the laser sputtering apparatus K3 is the same as that of the laser sputtering apparatus K1, the description thereof is abbreviated for the sake of brevity. The pulsed laser beam 2 emitted by the laser oscillator 1 is converged by the condenser lens 12 so as to be introduced into a cylindrical inner surface of the scattering optical device 13. If processing is performed, for example, a coating for reflecting the laser beam 2 is provided on the cylindrical inner surface of the scattering optical device 13, the laser beam 2 proceeds in the scattering optical device 13 through its repeated reflection on the cylindrical inner surface of the scattering optical device 13 such that the distribution of intensity of the laser beam 2 is made uniform. Since the laser beam 2 which has flowed out of the scattering optical device 13 proceeds while spreading, the laser beam 2 is corrected to substantially parallel light by the convex lens 14 and then, is guided to the condenser lens 5 by the reflecting mirror 4. Thereafter, in the same manner as in the laser sputtering apparatus K1 of FIG. 2, the laser beam 2 is irradiated onto the target 7 such that the thin film 10 having uniform thickness and structure is formed on the substrate 9.

Meanwhile, it is needless to say that the scattering optical device 13 may have shapes other than a cylindrical shape.

As is apparent from the foregoing description, the distribution of intensity of the laser beam, which most likely is most intense at the central portion of the laser bear, can be made uniform in the present invention. As a result, a force for effecting sputtering through irradiation of the target is also made uniform, so that processing of the target based on sputtering action of the laser beam is made uniform and thus, the thin film having uniform thickness and structure can be formed on the substrate.

Although the present invention has been fully described by way of example with reference to the accompanying drawings, it is to be noted here that various changes and modifications will be apparent to those skilled in the art. Therefore, unless such changes and modifications otherwise depart from the scope of the present invention, they should be construed as being included therein.

What is claimed is:

1. A laser sputtering apparatus comprising:
   a laser oscillator for emitting a pulsed laser beam;
   an optical unit for uniforming intensity of the laser beam;
   a vacuum tank which contains a target;
   an optical system for irradiating the laser beam onto said target through said optical unit; and
   wherein said optical unit is formed by a combination of aspherical mirrors.

2. A laser sputtering apparatus comprising:
   a laser oscillator for emitting a pulsed laser beam;
   an optical unit for uniforming intensity of the laser beam;
   a vacuum tank which contains a target;
   an optical system for irradiating the laser beam onto said target through said optical unit; and
   wherein said optical unit is formed by a tabular scattering optical device.

3. A laser sputtering apparatus as claimed in claim 1, wherein said optical system includes a reflecting mirror and a condenser lens.

4. A laser sputtering apparatus as claimed in claim 2, wherein said optical system includes first and second condenser lenses, a convex lens and a reflecting mirror.

* * * * *